(12) United States Patent
Huijsing et al.

(10) Patent No.: US 9,294,049 B2
(45) Date of Patent: Mar. 22, 2016

(54) FAST-SETTLING CAPACITIVE-COUPLED AMPLIFIERS

(71) Applicant: Maxim Integrated Products, Inc., San Jose, CA (US)

(72) Inventors: Johan Hendrik Huijsing, Schipluiden (NL); Qinwen Fan, Delft (NL); Kofi Afolabi Anthony Makinwa, Delft (NL); Daihong Fu, Shanghai (CN); Jun Wu, Shanghai (CN); Lixia Zhou, Shanghai (CN)

(73) Assignee: Maxim Integrated Products, Inc., San Jose, CA (US)

( * ) Notice: Subject to any disclaimer, the term of this patent is extended or adjusted under 35 U.S.C. 154(b) by 24 days.

(21) Appl. No.: 14/180,639

(22) Filed: Feb. 14, 2014

(65) Prior Publication Data

US 2014/0232456 A1 Aug. 21, 2014

(30) Foreign Application Priority Data

Feb. 16, 2013 (CN) .......................... 2013 1 0122194

(51) Int. Cl.

| | |
|---|---|
| *H03F 1/02* | (2006.01) |
| *H03F 1/56* | (2006.01) |
| *H03F 3/45* | (2006.01) |
| *H03F 1/14* | (2006.01) |
| *H03F 3/387* | (2006.01) |

(52) U.S. Cl.
CPC .. *H03F 1/56* (2013.01); *H03F 1/14* (2013.01); *H03F 3/387* (2013.01); *H03F 3/45071* (2013.01); *H03F 3/45475* (2013.01); *H03F 2200/135* (2013.01); *H03F 2200/459* (2013.01); *H03F 2203/45458* (2013.01)

(58) Field of Classification Search
CPC ............ H03F 1/02; H03F 1/14; H03F 1/303; H03F 3/19; H03F 3/005; H03F 3/393; H03F 3/3042
USPC ...................... 330/9, 10, 69, 107, 124 R, 126, 330/252–261, 292, 295, 310; 327/124, 307; 341/118, 139; 455/127.3
See application file for complete search history.

(56) References Cited

U.S. PATENT DOCUMENTS

| | | | |
|---|---|---|---|
| 6,559,720 | B1 | 5/2003 | Huijsing et al. |
| 6,734,723 | B2 | 5/2004 | Huijsing et al. |
| 7,132,883 | B2 | 11/2006 | Huijsing et al. |

(Continued)

OTHER PUBLICATIONS

Fan, Qinwen, et al., "A 1.8 μW 60 nV/√Hz Capacitively-Coupled Chopper Instrumentation Amplifier in 65 nm CMOS for Wireless Sensor Nodes", *IEEE Journal of Solid-State Circuits*, vol. 46, No. 7, (Jul. 2011), pp. 1534-1543.

(Continued)

*Primary Examiner* — Steven J Mottola
*Assistant Examiner* — Hafizur Rahman
(74) *Attorney, Agent, or Firm* — Blakely Sokoloff Taylor & Zafman LLP

(57) ABSTRACT

Fast-settling capacitive-coupled amplifiers are disclosed. The amplifiers use two Capacitive Coupled paths embedded in a Multipath Hybrid Nested Miller Compensation topology. One path is a direct high frequency path and the other path is a slower stabilization path. This combination results in a flat frequency response to and through the chopper frequency, and a fast settling response. Various exemplary embodiments are disclosed, including operational amplifier and instrumentation amplifier configurations.

29 Claims, 19 Drawing Sheets

(56) References Cited

U.S. PATENT DOCUMENTS

| | | | |
|---|---|---|---|
| 7,202,738 | B1 | 4/2007 | Huijsing et al. |
| 7,209,000 | B2 | 4/2007 | Huijsing et al. |
| 7,385,443 | B1 | 6/2008 | Denison |
| 7,535,295 | B1 | 5/2009 | Huijsing et al. |
| 7,696,817 | B1 | 4/2010 | Boucher et al. |
| 7,714,757 | B2 | 5/2010 | Denison et al. |
| 7,847,628 | B2 | 12/2010 | Denison |
| 8,120,422 | B1 | 2/2012 | Huijsing et al. |
| 8,179,195 | B1 | 5/2012 | Huijsing et al. |
| 8,354,881 | B2 | 1/2013 | Denison |

OTHER PUBLICATIONS

Fan, Qinwen, et al., "A Capacitively Coupled Chopper Instrumentation Amplifier with a ±30V Common-Mode Range, 160 dB CMRR and 5μV Offset", *2012 IEEE International Solid-State Circuits Conference*, Session 21, Analog Techniques, (Feb. 22, 2012), pp. 374-376.

Huijsing, Johan, "Operational Amplifiers, Theory and Design, Second Edition", Chapters 6.2, 10.5, 10.7, 10.8 and 10.10, Springer Science+Business Media B.V., (2011), pp. 162-197, 358-361, 366-376, 382-389.

Rothan, Frederic, et al., "A ±1.5% Nonlinearity 0.1-to-100A Shunt Current Sensor Based on a 6kV Isolated Micro-Transformer for Electrical Vehicles and Home Automation", *2011 IEEE International Solid-State Circuits Conference (ISSCC)*, Session 6, Sensors & Energy Harvesting, 6.5, (Feb. 21, 2011), 3 pp total.

Wu, Rong, et al., "A Chopper Current-Feedback Instrumentation Amplifier With a 1 mHz $1/f$ nose Corner and an AC-Coupled Ripple Reduction Loop", *IEEE Journal of Solid-State Circuits*, vol. 44, No. 12, (Dec. 2009), pp. 3232-3243.

Advisory Action Dated Mar. 6, 2015; U.S. Appl. No. 13/325,847.
Notice of Allowance Dated May 7, 2015; U.S. Appl. No. 13/325,847.
Office Action Dated Dec. 18, 2013; U.S. Appl. No. 13/325,847.
Office Action Dated Jul. 1, 2014; U.S. Appl. No. 13/325,847.
Office Action Dated Nov. 13, 2014; U.S. Appl. No. 13/325,847.
Office Action Dated Sep. 24, 2013; U.S. Appl. No. 13/325,847.

FAST-SETTLING CAPACITIVE-COUPLED AMPLIFIERS

CROSS-REFERENCE TO RELATED APPLICATIONS

This application is based upon and claims the benefit of priority from Chinese Patent Application No. 201310122194.8 filed Feb. 16, 2013.

BACKGROUND OF THE INVENTION

1. Field of the Invention

The present invention relates to the field of fast settling amplifiers.

2. Prior Art

In current-sense applications for power management of cell phones, laptops, or electric cars, a small differential-mode (DM) voltage (in the order of mVolts) has to be measured across a current-sense resistor, in the presence of a large common-mode (CM) voltage on the sense resistor on the order of Volts or tens of Volts higher than the amplifier supply voltage. Instrumentation amplifiers (IAs) are frequently used for sensor interfacing. To solve the DM voltage measurement while the CM voltage is beyond the supply-rail, often a part of the input circuitry such as a resistor bridge or a voltage-to-current converter is allowed to draw its CM supply current from the sense resistor. This input CM supply current often has an undesired influence on the system to be measured. Therefore, IAs with capacitive-coupled input choppers have been developed that do not draw input CM supply current, while able to sense beyond their supply-rail voltage.

Capacitive-Coupled Amplifiers with Slow Settling

The prior art capacitive-coupled operational amplifiers and instrumentation amplifiers from the book "Operational Amplifiers, Theory and Design, Second Edition" (2011) of Johan Huijsing, one of the present inventors, do not have a straight frequency characteristic at the chopping frequency. These amplifiers have a slow-settling ripple at the chopping frequency after a step in the input signal. Therefore these amplifiers are not fit for fast-settling signal transfer. Their useful bandwidth lies below the chopper frequency.

The chopper-stabilized amplifiers of FIGS. 1 and 2 have an RC low-pass filter between the input chopper and the chopper behind, which acts as a notch filter in the signal transfer. This means that there is no feedback at the chopping frequency. Therefore an uncontrolled up-turn of the chopper ripple can occur. This causes a slow-settling ripple component after a step.

The chopper amplifiers of FIGS. 3, 4 and 5 have a ripple reduction loop. This means by definition, there is a notch in the frequency response at the chopper frequency. That also means there is a slow-settling ripple at the clock frequency after a step.

DETAILED DESCRIPTION OF THE PREFERRED EMBODIMENTS

The present innovation allows measuring signals in Wide Band applications, meaning approaching the chopper frequency or beyond the chopper frequency without a slow-settling or non-settling chopper ripple response.

Figure 1:
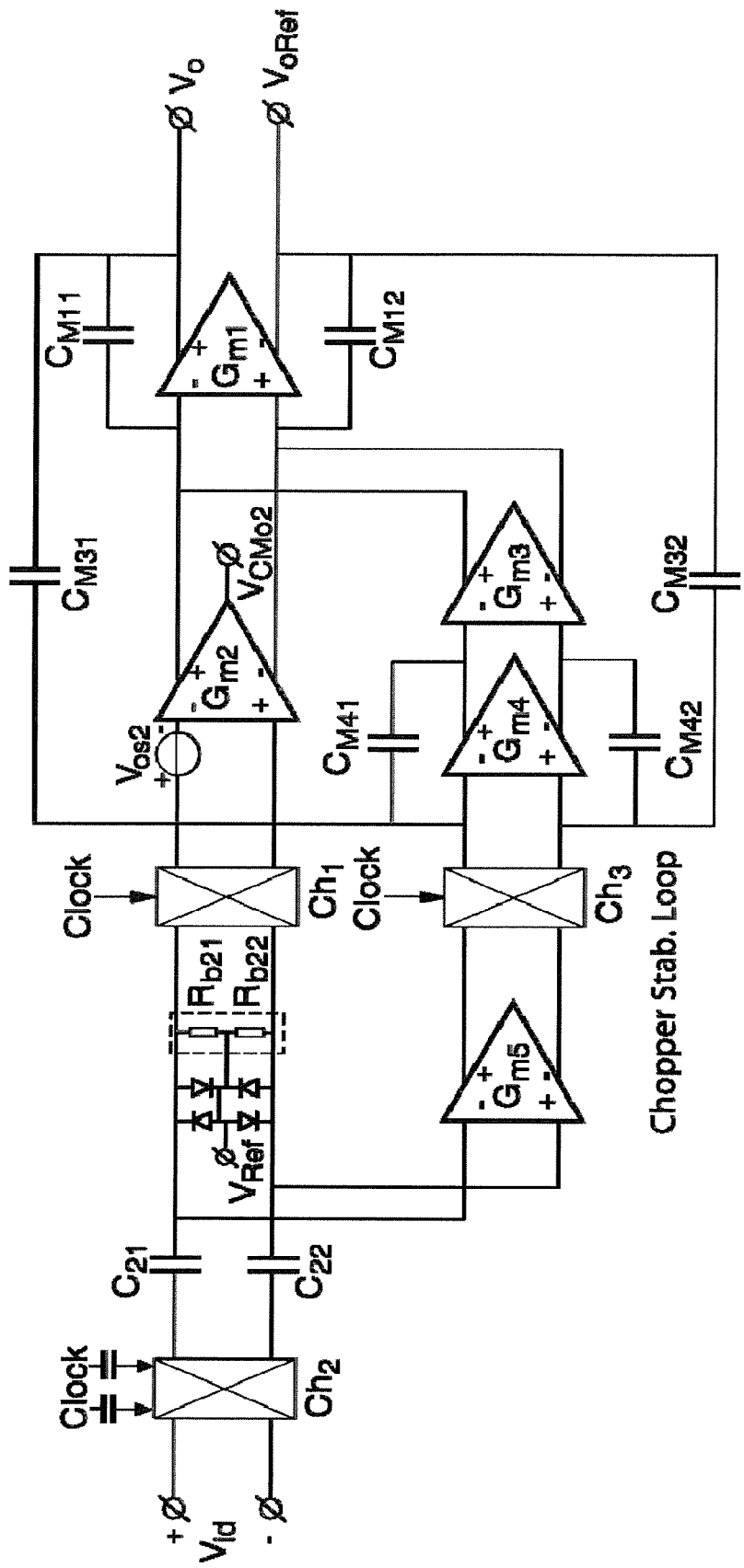
FIG. 1 shows a prior art capacitive-coupled chopper-stabilized operational amplifier.
Figure 2:
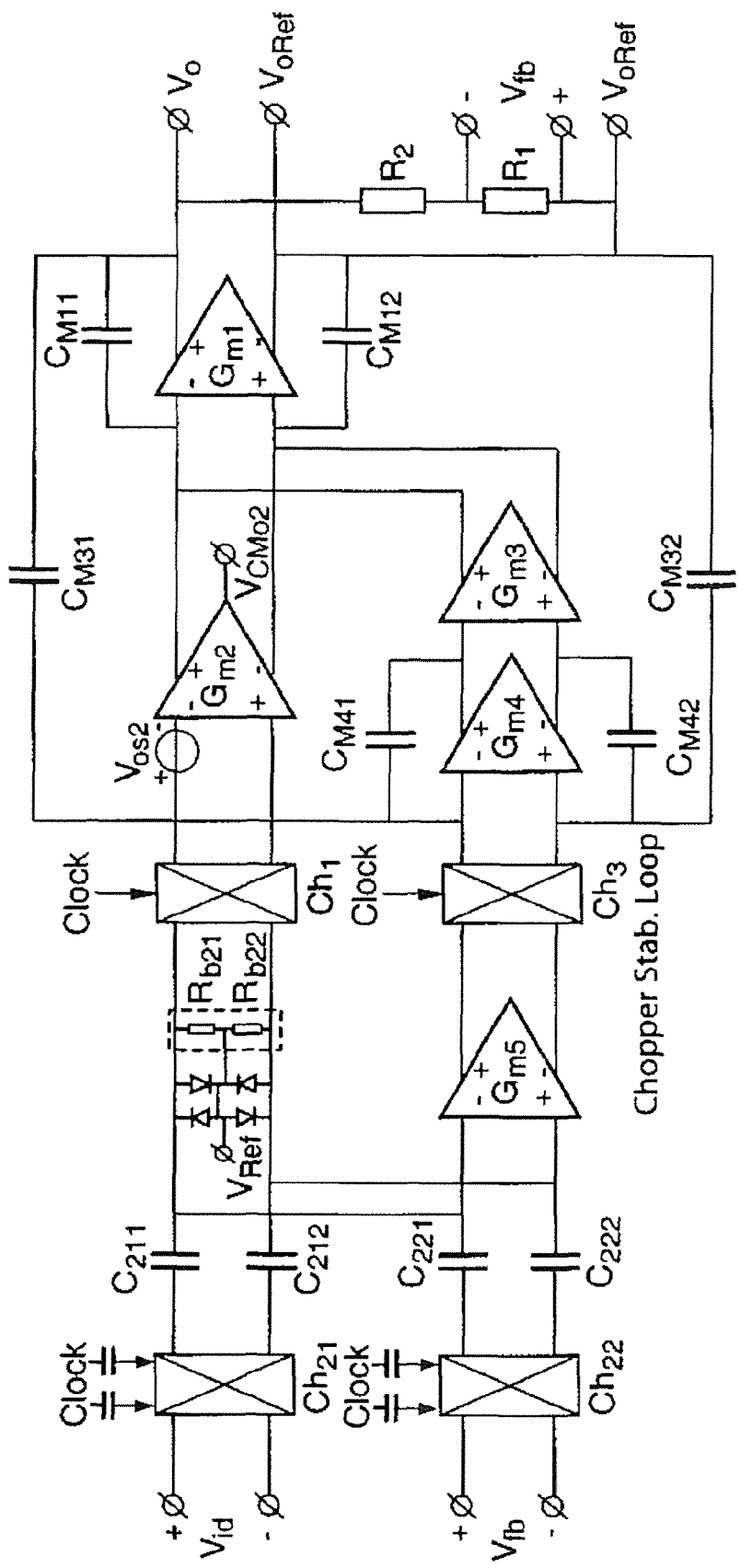
FIG. 2 shows a prior art capacitor-coupled chopper-stabilized instrumentation amplifier.
Figure 3:
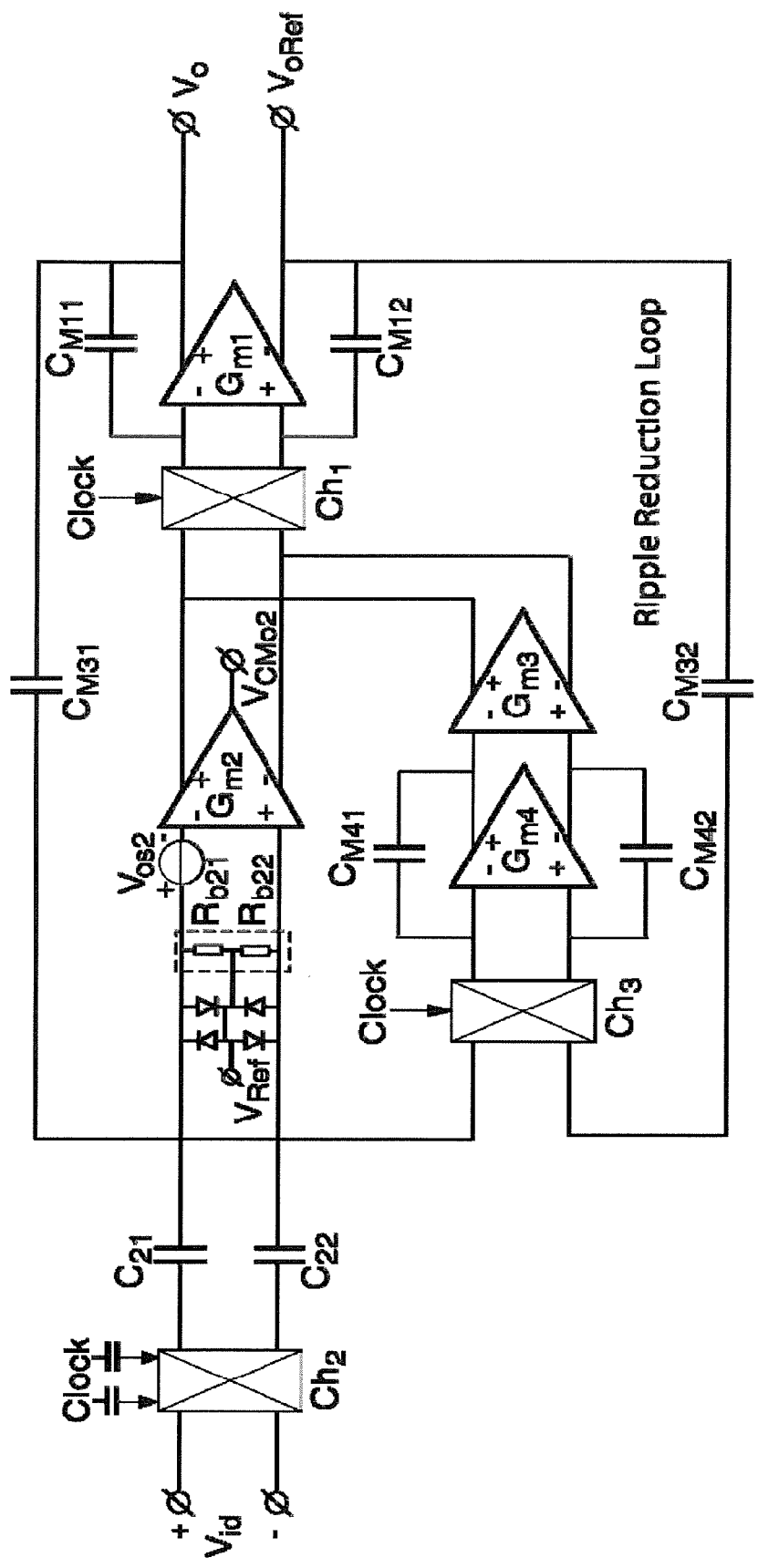
FIG. 3 shows a prior art capacitive-coupled chopper amplifier with ripple-reduction loop.
Figure 4:
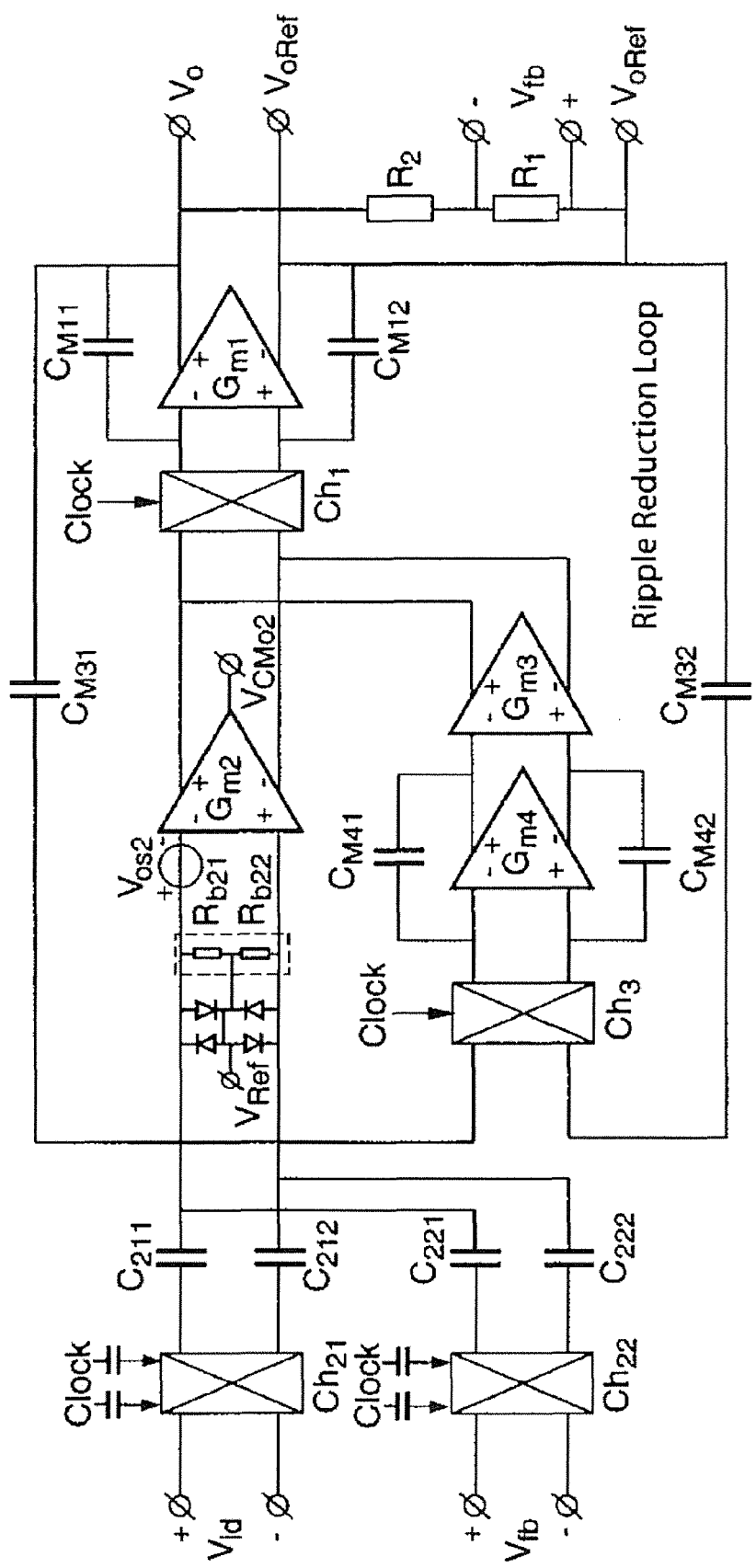
FIG. 4 shows a prior art capacitor-coupled chopper instrumentation amplifier with ripple-reduction loop.
Figure 5:
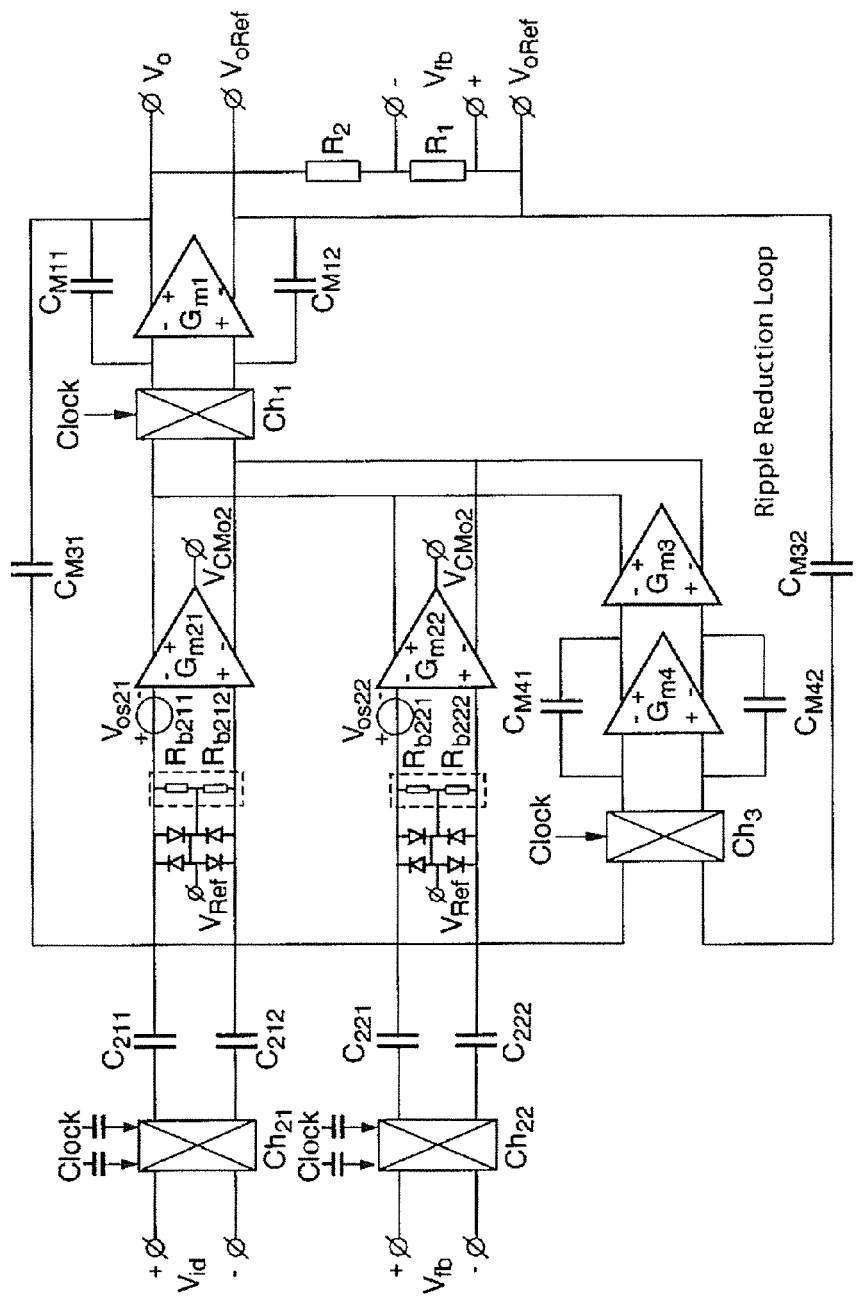
FIG. 5 shows a prior art capacitor-coupled current-feedback chopper instrumentation amplifier with ripple-reduction loop with high-impedance input.
Figure 6:
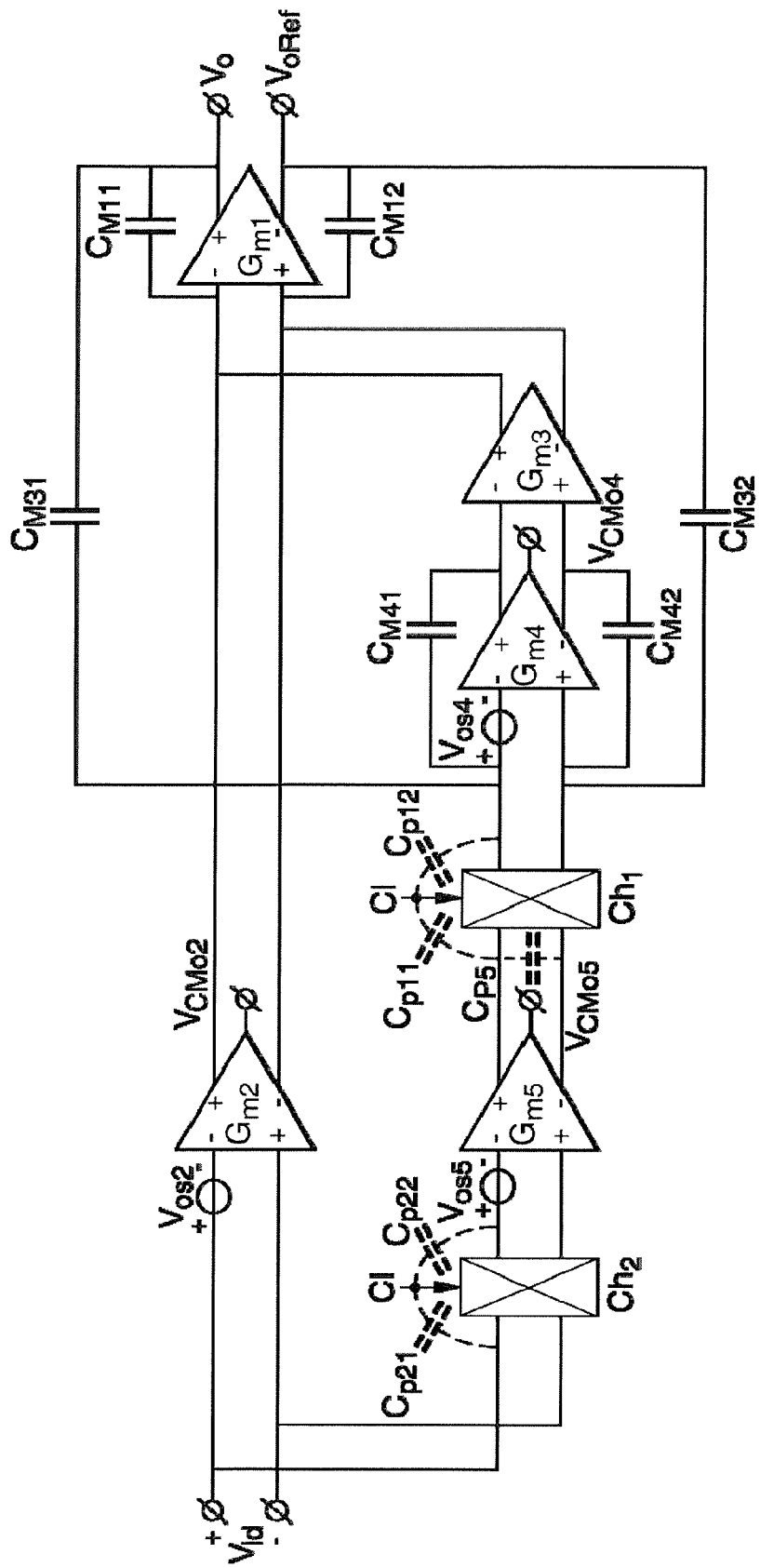
FIG. 6 shows a prior art chopper-stabilized operational amplifier.
Figure 7:
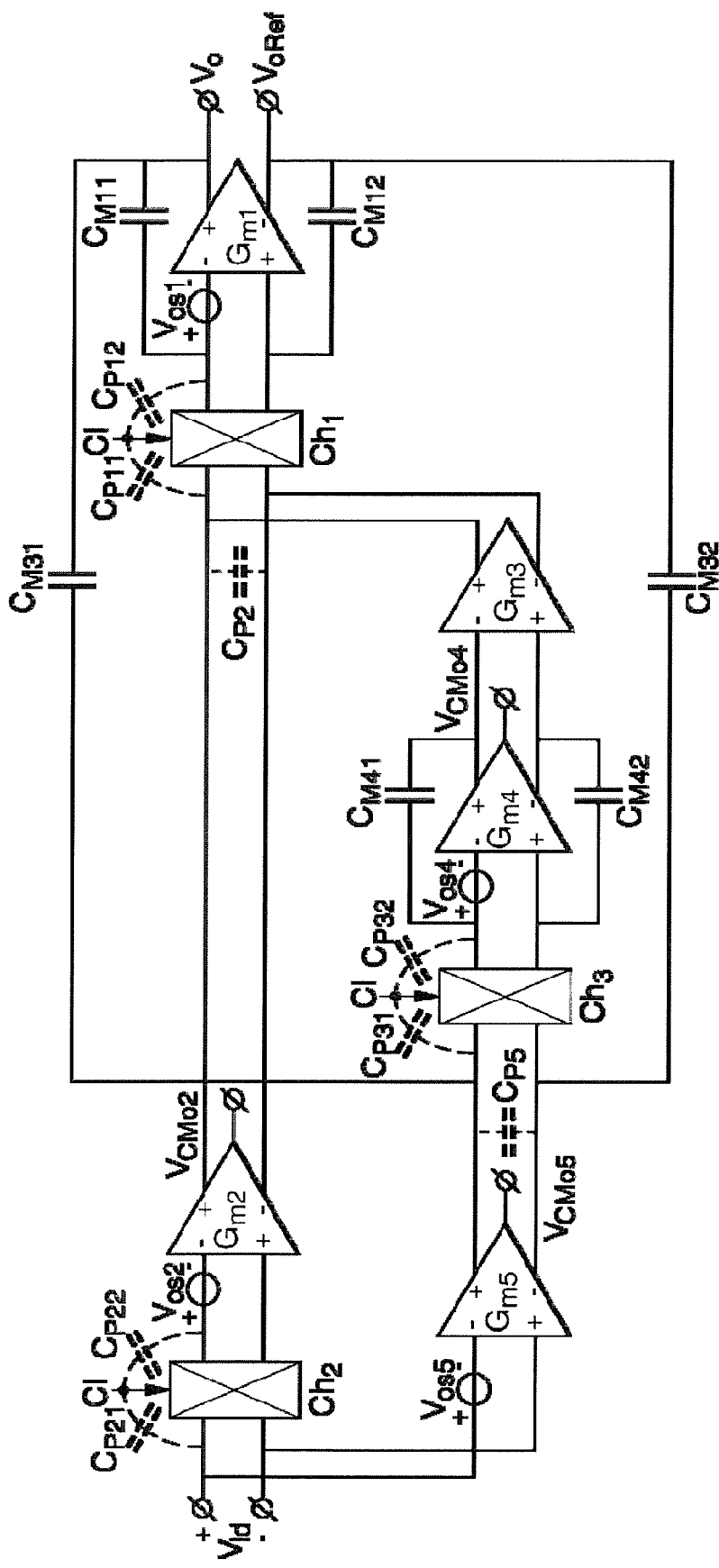
FIG. 7 shows a prior art chopper-stabilized chopper operational amplifier.

For a design of fast-settling capacitive-coupled amplifiers, reference is made to the chopper-stabilized amplifiers of Chapter 10.7 of "Operational Amplifiers, Theory and Design, Second Edition" (Johan Huijsing, 2011), such as the amplifier of FIG. 6, and to the chopper-stabilized chopper amplifiers of Chapter 10.8, such as in FIG. 7. These amplifiers have a straight frequency characteristic at the chopping frequency and basically no slow settling chopper ripple for a step function, meaning that their bandwidth is useful at much higher frequencies than the chopping frequency.

Figure 8:
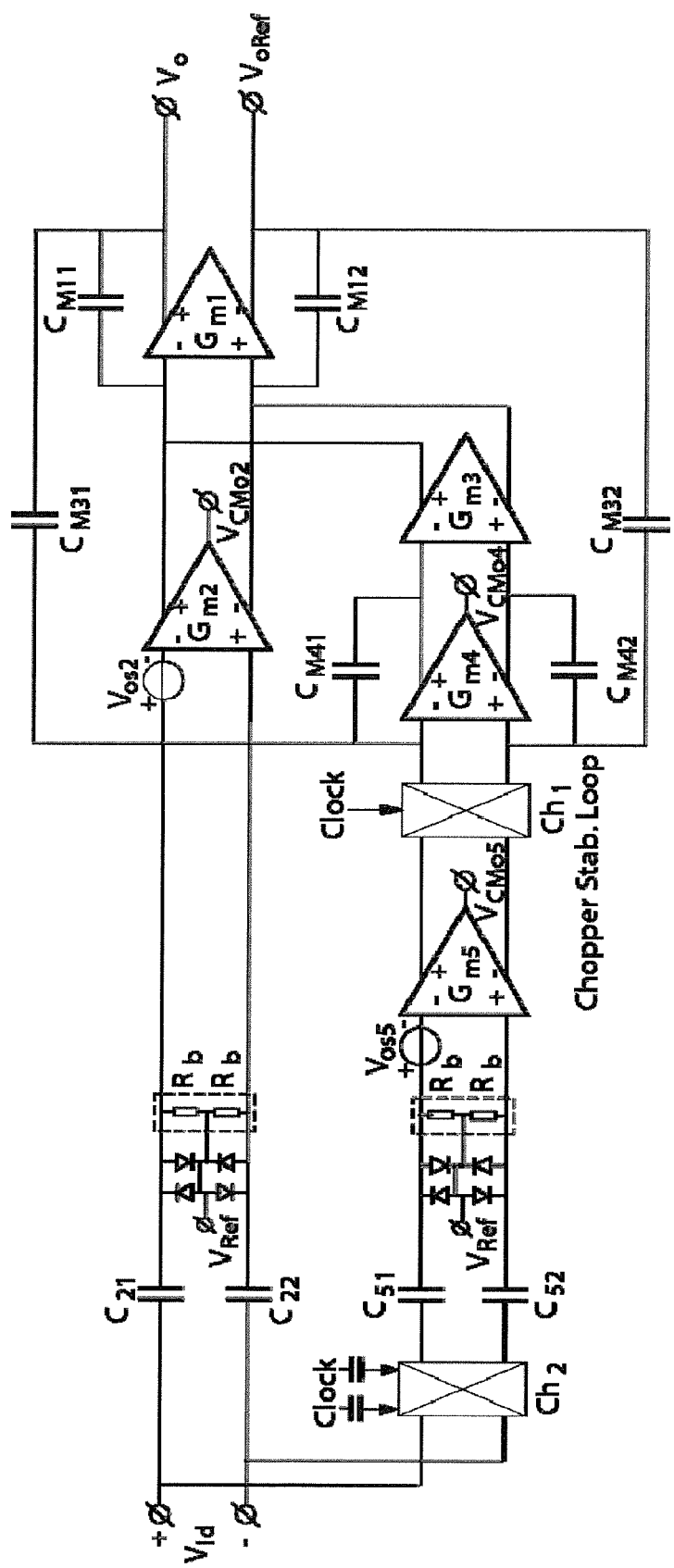
FIG. 8 shows a capacitive-coupled chopper-stabilized operational amplifier with hybrid-nested Miller compensation and fast settling.
Figure 19:
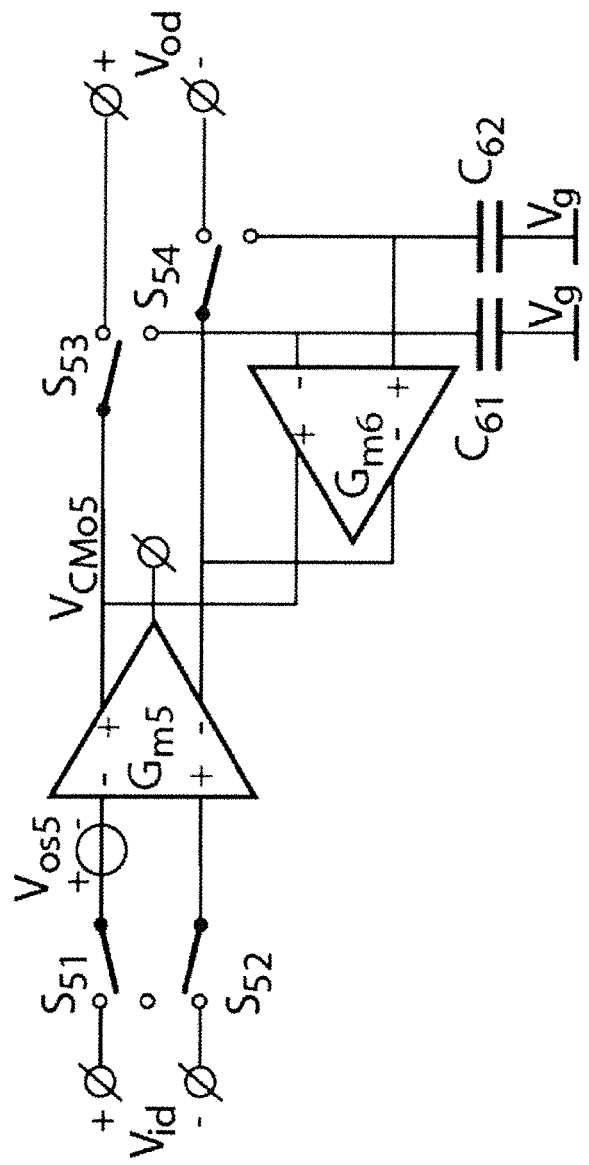
FIG. 19 illustrates an exemplary circuit for auto-zeroing Gm5 as may be used in the embodiments of FIGS. 8-11, 13 and 14.

From the chopper-stabilized amplifier of FIG. 6, the two-path capacitive-coupled amplifier of FIG. 8 is derived. It has a high frequency path through Gm2 that includes the chopper frequency and a low frequency chopper path through Gm5. Without showing it to avoid cluttering the Figure, Gm5 has still to be auto-zeroed or chopper stabilized or given a ripple reduction loop for a low output ripple. A complete Figure for Gm5 with exemplary auto-zeroing circuit is shown in FIG. 19. The hybrid-nested Miller compensation scheme with CM31 and CM32 takes care of a straight frequency characteristic (see section 6.2 of "Operational Amplifiers, Theory and Design, Second Edition" (Johan Huijsing, 2011) for further information on Compensation techniques, particularly Miller Compensation, Nested Miller Compensation and Hybrid-Nested Miller Compensation). For the same reason, the hybrid-nested Miller compensation is used in the embodiments of FIGS. 9-11, 13, 14 and 17.

On the output side of the coupling capacitors C21,C22 and C51,C52 of the embodiment of FIG. 8, as well as for the corresponding or equivalent coupling capacitors of the other embodiments to be described herein, a common mode reference $V_{Ref}$ is coupled to each side of the differential output of each capacitor pair through a resistor Rb and a pair of diodes connected in parallel with opposite conduction directions. As in the prior art, these diodes limit the magnitude of the voltage on each side of the respective differential signal path to one diode voltage drop above or below the voltage $V_{Ref}$, and similarly limit the common mode voltage swing to two diode voltage drops. This protects the subsequent amplifiers from a common mode spike on the amplifier input from the sudden connection of the amplifier to a voltage source well out of the amplifier power supply voltage range, and from a high differential voltage caused by the momentary connection of only one line of the differential input to such a voltage. The resistors Rb cause the common mode of the differential voltage output of the respective capacitor pair to settle at the voltage $V_{Ref}$.

Figure 9:
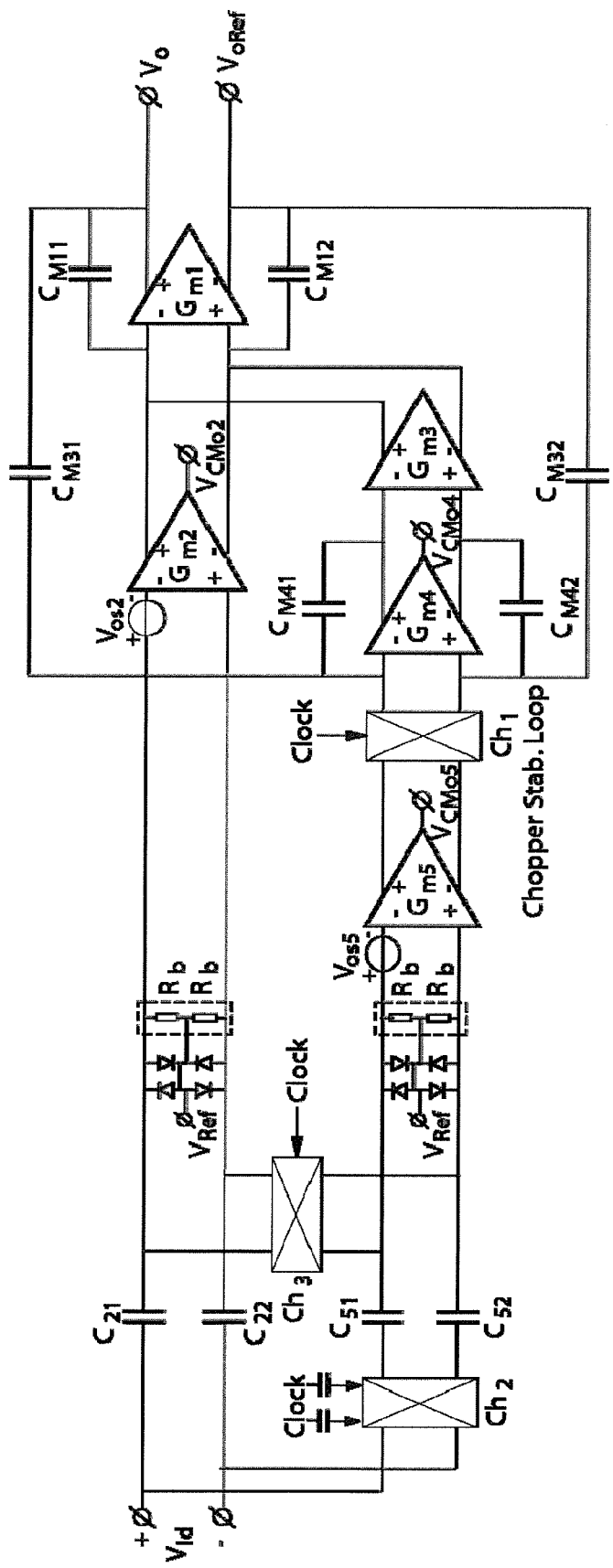
FIG. 9 shows a capacitive-coupled chopper-stabilized operational amplifier with hybrid-nested Miller compensation, fast settling and reduced chopper ripple.

The output ripple due to the offset of Gm5 can be reduced by introducing a path from the output through the overall feedback to the input that rectifies the ripple and corrects the offset of Gm5. Such a path is created by inserting another chopper Ch3 between the output of the coupling capacitors C2 and the input of Gm5. Chopper Ch3 rectifies the feedback triangle and square-wave ripple at the input and compensates the offset of Gm5. This is shown in FIG. 9. Again without showing the complete auto-zeroing circuitry in this Figure, Gm5 still has to be auto-zeroed (or chopper stabilized or given a ripple reduction loop) for a low output ripple, such as the auto-zeroing circuit of FIG. 19. Without C21 and C22 the circuit falls back on FIG. 10.10.1 of the book mentioned earlier, which has a slow settling ripple after an input voltage step.

Figure 10:
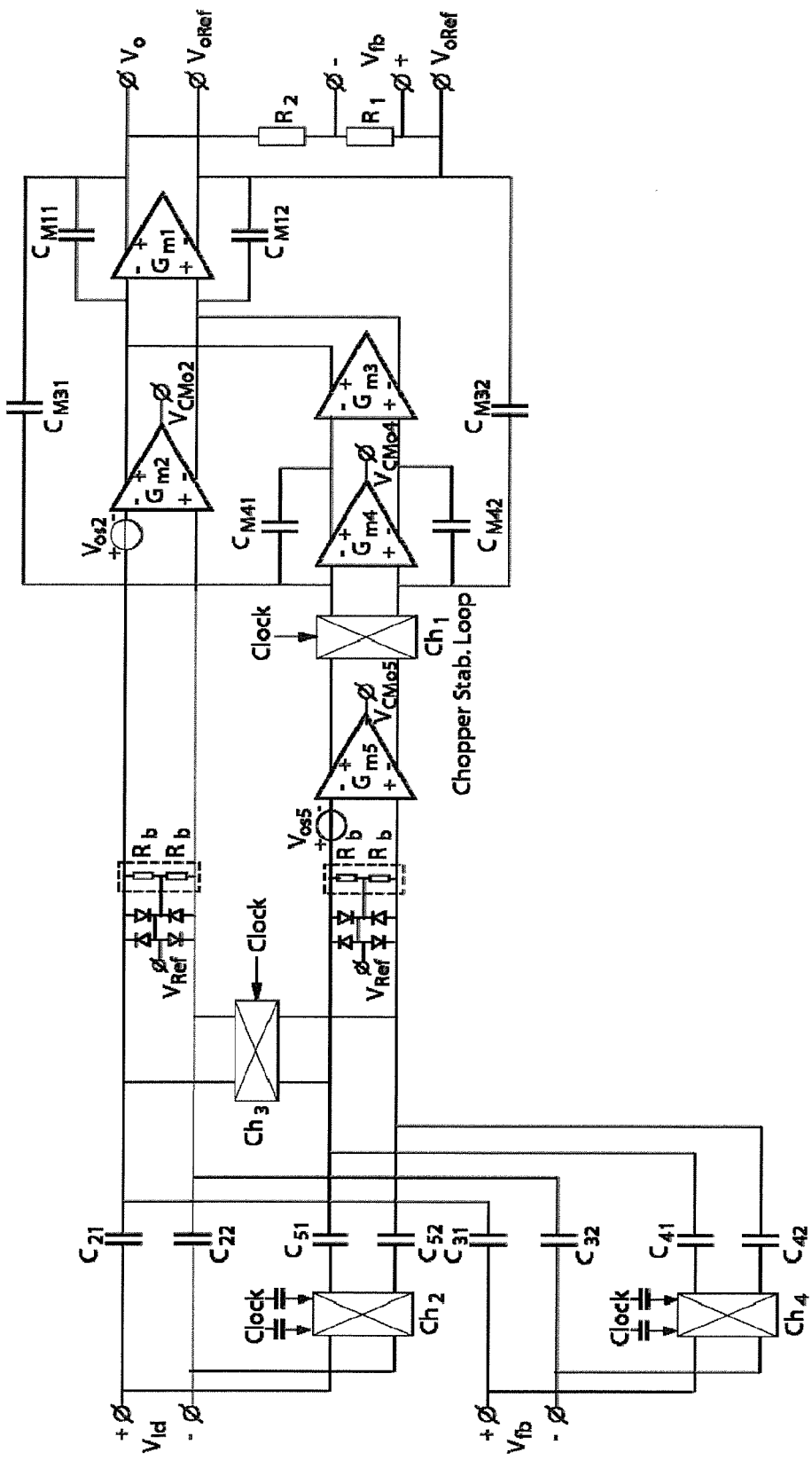
FIG. 10 shows a capacitive-coupled chopper-stabilized instrumentation amplifier with hybrid-nested Miller compensation, fast settling and reduced chopper ripple.

From FIG. 9, a capacitive-coupled instrumentation amplifier can be created by adding two more capacitor pairs and an extra chopper Ch4 as shown in FIG. 10. Without the feedforward capacitors C21 and C22, C31 and C32, the circuit falls back on FIG. 10.10.5 of the book with a slow settling ripple. The signal bandwidth must be smaller than the chopping frequency.

Figure 11:
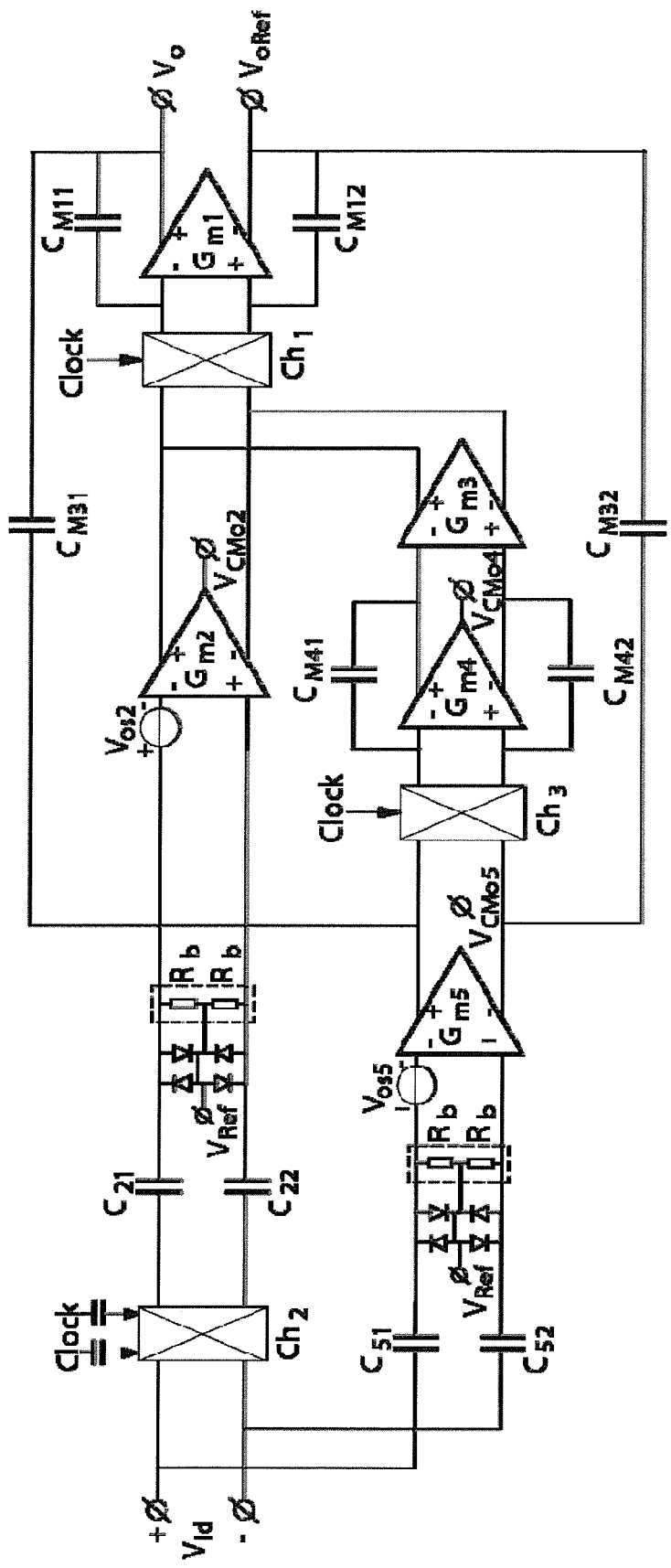
FIG. 11 shows a capacitive-coupled chopper-stabilized chopper operational amplifier with hybrid-nested Miller compensation and fast settling.
Figure 12:
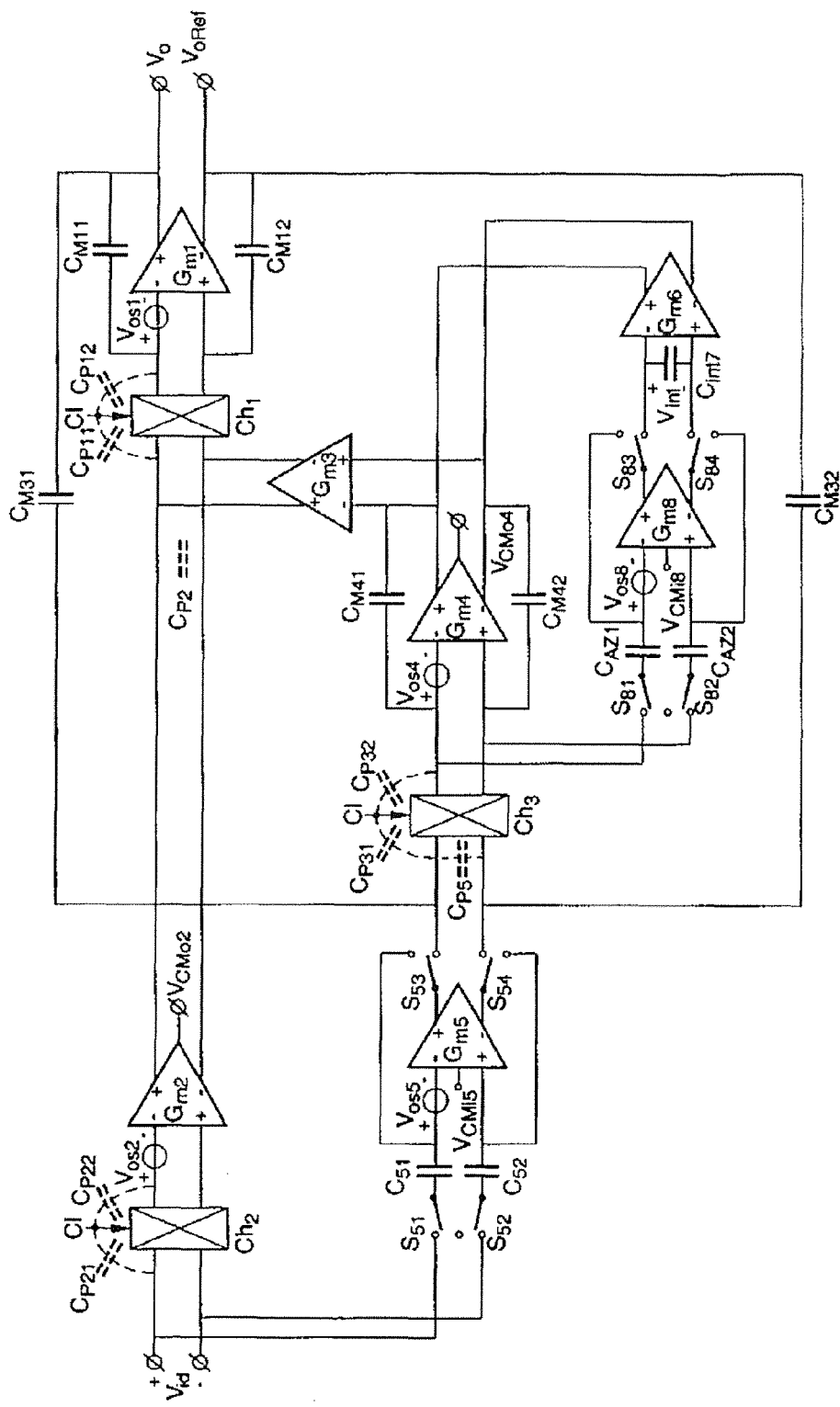
FIG. 12 shows a prior art chopper-stabilized chopper operational amplifier with multipath hybrid-nested Miller compensation, auto-zero Gm5 and Gm4.

From the prior art chopper-stabilized amplifier of FIG. 7, a two-path capacitive-coupled amplifier of FIG. 11 is derived. It has a low-and-high frequency path through the chopper amplifier stage Gm2 and a chopper frequency path through Gm5. The hybrid-nested Miller compensation scheme with CM3 takes care of a straight frequency characteristic. Without showing it, Gm5 has still to be auto-zeroed or chopper stabilized or given a ripple reduction loop for a low output offset and ripple, the auto-zeroing being shown in FIG. 19. Also the offset of Gm4 has to be reduced, as shown by example in FIG. 12. In particular, when switches S51 and S52 are set in the position to short the inputs to capacitors C51 and C52 together, switches S53 and S54 are set in the position to feed back the outputs of Gm5 to in respective inputs. Since this creates two negative feedback loops, the differential input to Gm5 will be changed to approximate the input offset of Gm5, schematically shown as Vos5, so that the differential output of Gm5 is reduced to approximately the input offset of Gm5 within an accuracy depending on the gain of Gm5. Since the inputs of capacitors C51 and C52 are shorted together at this time, the capacitors will be charged to the differential voltage correcting the input offset Vos5, which voltage the capacitors will hold as the switches are switched to their other position for normal operation of the signal path until the next auto-zeroing operation. The common mode voltage for the input and output of Gm5 is set by the common mode voltage Vcm5 input to Gm5. The auto-zeroing for Gm4 works the same way.

The output ripple due to the offset of Gm2 in FIG. 11 can be reduced by introducing a path from the output through the overall feedback to the input that rectifies the ripple and corrects the offset of Gm2. Such a path is created by inserting another chopper Ch4 between the output of the coupling capacitors C5 and the input of Gm2. This additional chopper CH4 shown in FIG. 13 rectifies the feedback ripple at the input and partly compensates the offset of Gm2. Without showing it, Gm5 still has to be auto-zeroed or chopper stabilized or given a ripple reduction loop for a low output offset and ripple, again as shown in FIG. 19.

Figure 13:
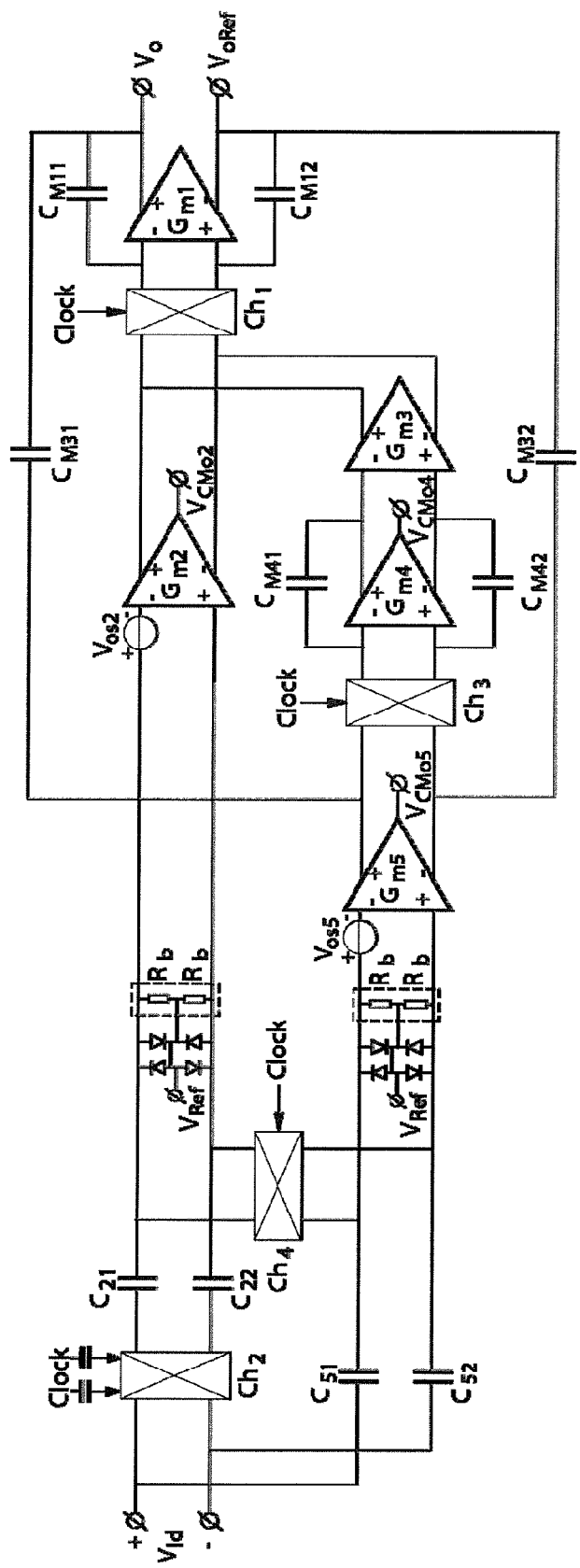
FIG. 13 shows a capacitive-coupled chopper-stabilized chopper operational amplifier with hybrid-nested Miller compensation, fast settling and reduced chopper ripple.
Figure 14:
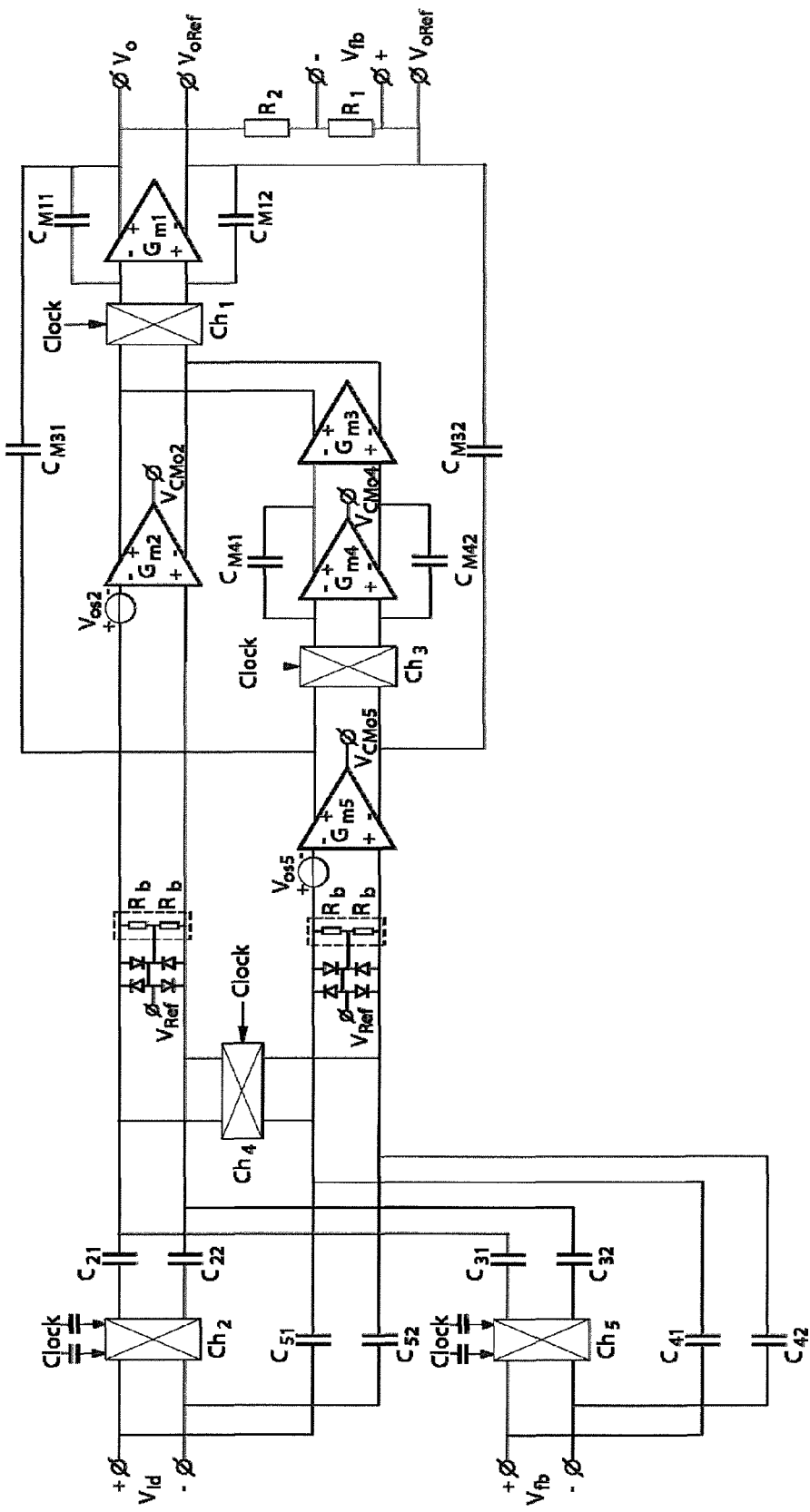
FIG. 14 shows a capacitive-coupled chopper-stabilized chopper instrumentation amplifier with hybrid-nested Miller compensation, fast settling and reduced chopper ripple.

From FIG. 13 a capacitive coupled instrumentation amplifier can be created by adding two more capacitor pairs C31, C32 and C41,C42 and an extra chopper Ch5 as shown in FIG. 14.

Figure 15:
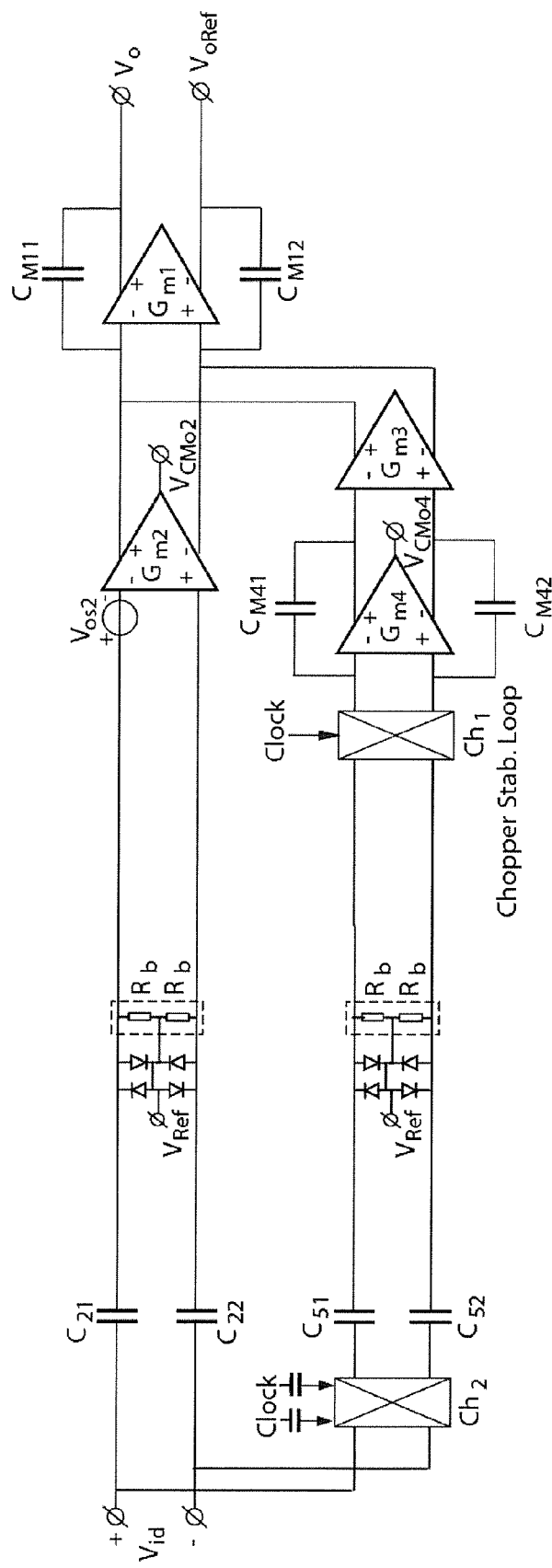
FIG. 15 illustrates a simplification of the embodiment of FIG. 8.
Figure 16:
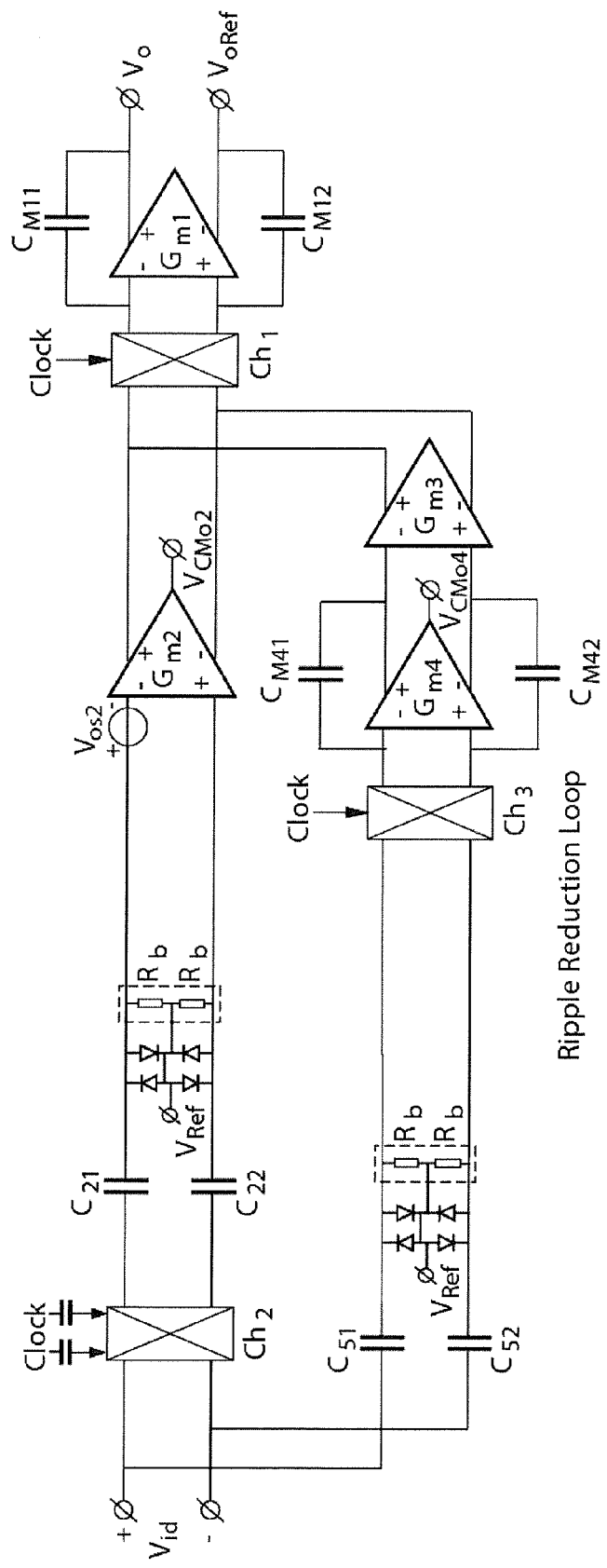
FIG. 16 illustrates a simplification of the embodiment of FIG. 11.
Figure 17:
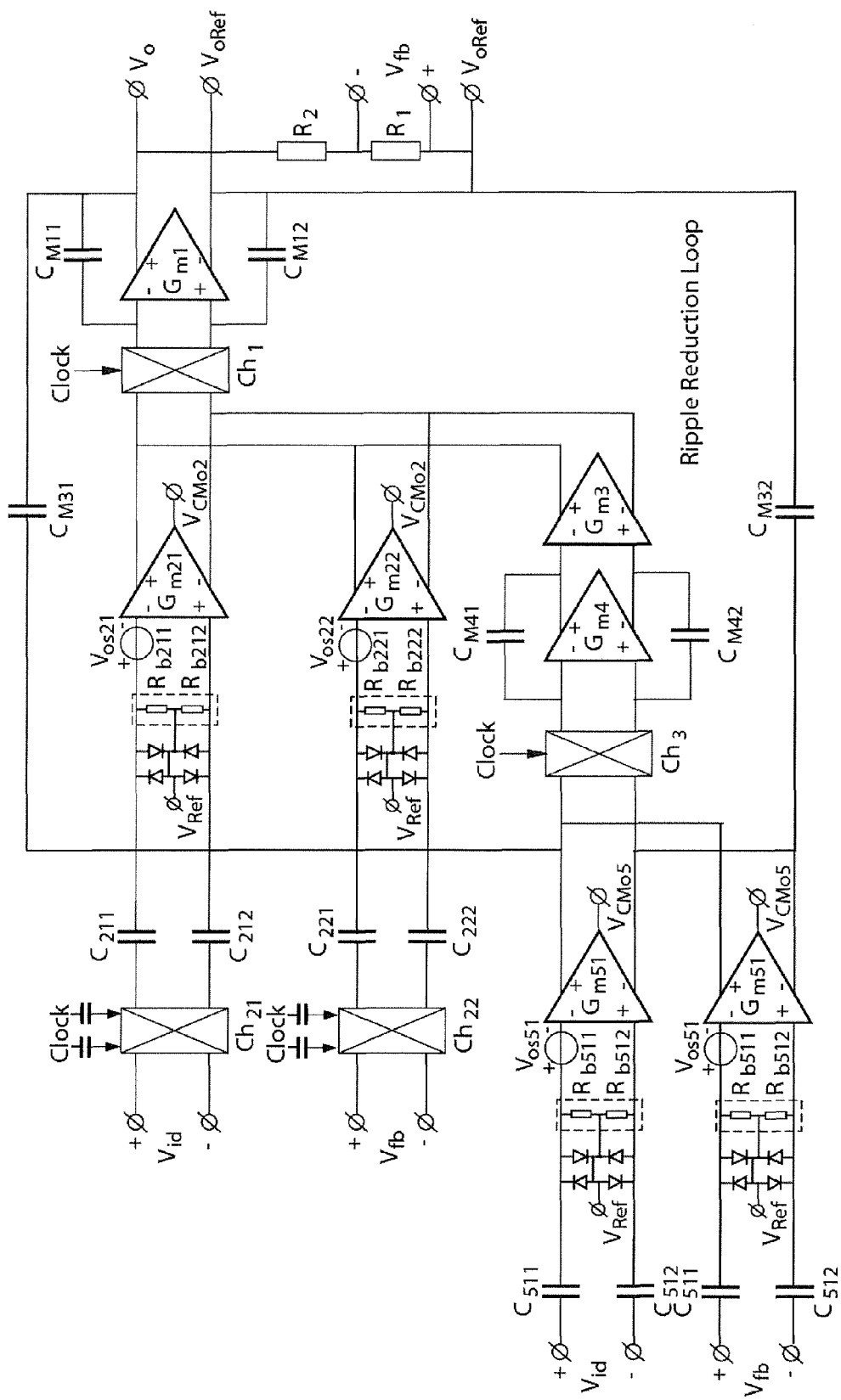
FIG. 17 illustrates a high differential input impedance embodiment of FIG. 14 with hybrid-nested Miller compensation.
Figure 18:
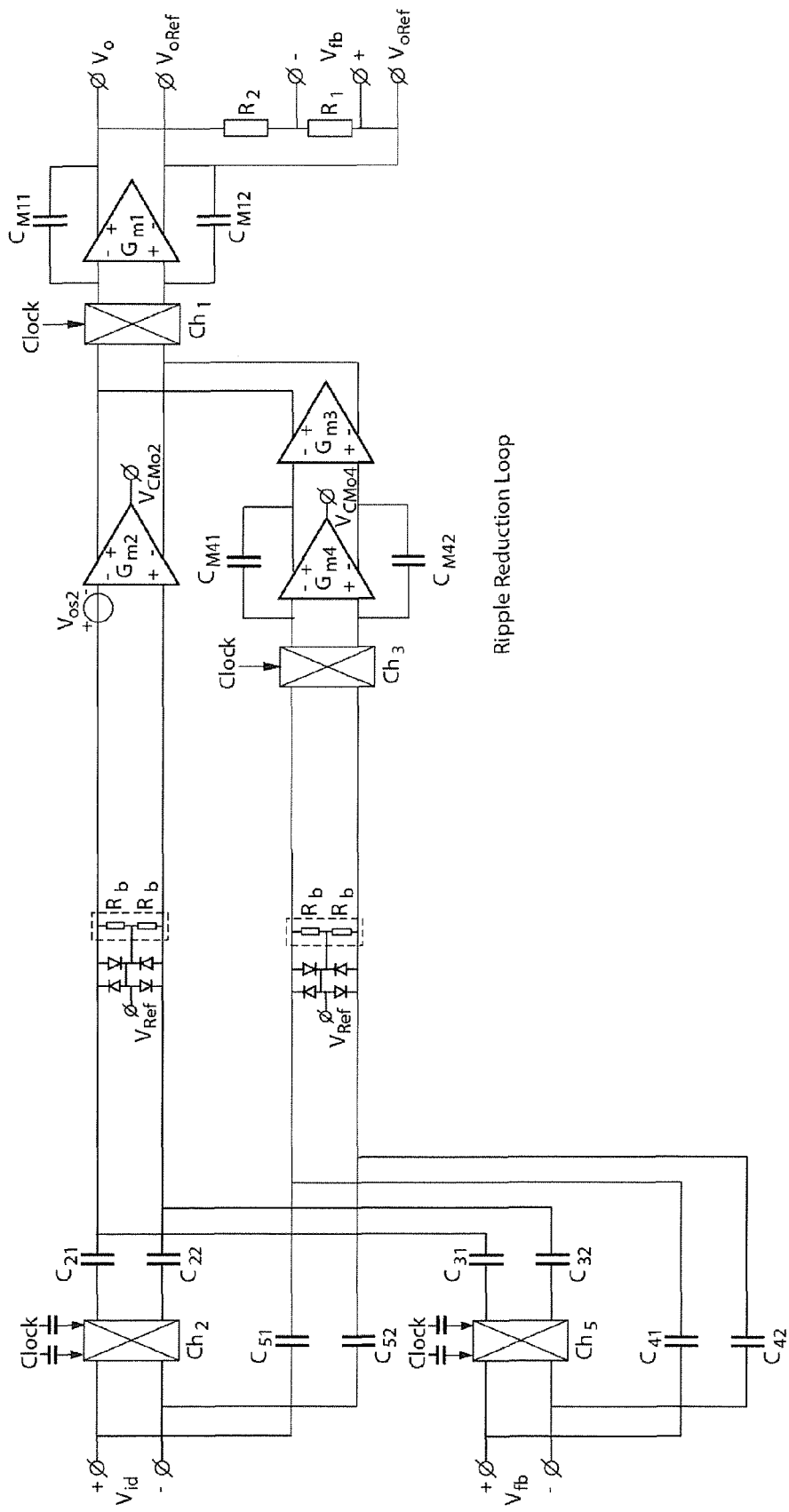
FIG. 18 illustrates a simplified embodiment of FIG. 14.

FIG. 15 is an embodiment similar to FIG. 8, but somewhat simplified to better illustrate the basic circuit. Similarly, FIG. 16 is a simplification of the embodiment of FIG. 11. FIG. 17 illustrates a high differential input impedance embodiment of FIG. 14, and FIG. 18 shows a simplified embodiment of FIG. 14. The high differential input impedance of the embodiment of FIG. 17 results from the fact that each input has its own high input impedance amplifier coupled to the input.

It was previously mentioned that in the amplifier systems of FIGS. 8-11, 13 and 14, Gm5 should be and is auto-zeroed. An exemplary circuit for such auto-zeroing of Gm5 for each of these amplifier systems may be seen in FIG. 19. In this circuit, when switches S51 and S52 are in the position shorting the two switches together, switches S53 and S54 are set at their lower positions, coupling the output of Gm5 to capacitors C61 and C62. With the switches S51 and S52 coupled together, the current output of Gm5 will be Gm5\*Vos5, the gain of Gm5 times its input offset. Gm6 will convert the voltage difference on capacitors C61 and C62 to provide a current offsetting the output current Gm5\*Vos5 of Gm5 so that capacitors C61 and C62 will stop charging. Under this condition, neglecting the input offset of Gm6 for the moment, the current output of Gm6 will be equal and opposite to the output of Gm5 so that the difference in voltage on capacitors C61 and C62 will be equal to Gm5/Gm6 times the input offset voltage of Gm5. The influence of the input offset of Gm6 will automatically be reduced by the voltage gain of Gm6. The auto-zeroing cycle is repeated periodically to update the charge on C61 and C62. This auto zeroing circuit for Gm5 may be used in the circuits of FIGS. 8-11, 13 and 14.

It was also pointed out that Gm5 should be auto-zeroed (or chopper stabilized or given a ripple reduction loop), with FIG. 19 providing an exemplary auto-zeroing Gm5 to avoid unnecessary cluttering of the other Figures. There are numerous auto-zeroing circuits that may be used, such as shown in the foregoing book in the left-hand part of FIG. 10.5.1, FIG. 10.5.2*a*, and FIG. 10.5.2*b*, with FIG. 19 being the middle one. The capacitors in the left-hand part of FIG. 10.5.1 have the memory function for the offset. Also with respect to Gm4, there are many ways the auto-zeroing and integration may co-exist. There is the serial way in which the auto-zeroing amplifier of FIG. 19 itself is actually the integrator amplifier Gm4 (see FIG. 6 of "A Capacitively Coupled Chopper Instrumentation Amplifier with a ±30V Common-Mode Range, 160 dB CMRR and 5 µV Offset", Q. Fan et al., 2012 ISSCC IEEE International Solid-State Circuits Conference, and also see FIG. 10.7 of the foregoing book). That is the easiest way. There is also a parallel way in which a separate integrator opamp Gm4 is monitored by an auto-zeroing circuit. See for instance FIG. 10.8.2 of the foregoing book. Besides auto-zeroing, Gm4 can instead be chopper stabilized using well known techniques.

In FIGS. 8-11, 13 and 14, at least one chopper is used to chop the input signal, which may have a common mode voltage which is well above (or conceivably well below) the amplifier system power supply voltage range. Consequently these choppers may be capacitively coupled to a clock operating within the power supply voltage operating range, if needed. The other choppers in these amplifiers could be capacitively coupled to the clock (see the foregoing article by Q. Fan et al.), but can also be directly driven by the clock as is commonly done.

When the capacitively coupled amplifier systems of the present invention are used as operational amplifiers in a resistive bridge feedback configuration, there will be two resistors, one from each leg of the voltage to be measured to a corresponding input to the amplifier system, and two additional resistors, one from each output of the amplifier system to a respective input (of the opposite polarity) of the amplifier system. In instrumentation amplifier systems in accordance with the present invention (FIGS. 10 and 14,), the outputs Vfb− and Vfb+ of the resistor divider R1 and R2 are connected back to respective feedback inputs of the opposite polarity for obtaining negative feedback. Note that in FIG. 10, the clock is shown capacitively coupled to chopper Ch4, though such capacitive coupling may not be required, as the feedback voltages are well within the amplifier system power supply voltage range. Also in FIG. 13, the clock is shown capacitively coupled to chopper Ch5, though such capacitive coupling also may not be required, as the feedback of this amplifier system is also within the amplifier system power supply voltage range.

When the operational amplifier versions of the amplifier system of the present invention are used in a resistive bridge feedback configuration, the resistors from each leg of the differential voltage to be measured to a corresponding input to the amplifier system create DC paths from the differential voltage to be measured. If the input CM voltage is large, these DC paths, if not very well balanced, will cause a DC offset on the amplifier system input which could be quite large, possibly exceeding the input signal sought to be measured. Accordingly in many applications, it may be better to use the capacitively coupled instrumentation amplifier system versions, as the feedback for the implementation amplifier systems has an amplifier system power supply voltage so the DC paths are of no significance. However if the operational amplifier systems of the present invention are used as integrators with capacitive feedback, the DC paths will remain as described.

In the foregoing description, reference has been made to amplifiers, with transconductance amplifiers being shown. These amplifiers are exemplary only, as voltage amplifiers may be used if desired. In that regard, the word amplifier as used in the claims to follow is used in the general sense to include amplifiers of both a single stage of amplification and amplifiers of multiple stages of amplification. Also the amplifiers may be realized in CMOS devices as well as bipolar devices or of a mixed transistor construction, though CMOS transistors in transconductance amplifiers are preferred.

Thus while certain preferred embodiments of the present invention have been disclosed and described herein for purposes of illustration and not for purposes of limitation, it will be understood by those skilled in the art that various changes in form and detail may be made therein without departing from the spirit and scope of the invention.

What is claimed is:

1. A differential amplifier system comprising:
   a chopper free signal path having a first differential amplifier with a first differential amplifier output coupled to a differential amplifier system output, the first differential amplifier having a first differential amplifier input capacitively coupled to a differential amplifier system input, the chopper free signal path not having any choppers therein; and
   a chopper signal path coupled between the differential amplifier system input and the differential amplifier system output, the chopper signal path having a first chopper having an input coupled to the differential amplifier system input and an output capacitively coupled to an input of a second chopper, the output of the second chopper being coupled through an integrator to the differential amplifier system output.

2. The differential amplifier system of claim 1 further comprised of a third chopper coupled between the differential input of the first differential amplifier and the input of the second chopper.

3. The differential amplifier system of claim 1 wherein each side of a differential input to the first differential amplifier and each side of a differential input to the second chopper is coupled to a respective reference voltage through a resistor, and coupled to the respective reference voltage through a pair of diodes coupled in parallel, the pair of diodes being connected with opposite directions of conduction to limit a magnitude of a voltage difference between the respective reference voltage and the respective side of the respective differential input.

4. The differential amplifier system of claim 1 wherein a clock signal for the first chopper is capacitively coupled to the first chopper.

5. The differential amplifier system of claim 1 further comprising a differential amplifier system feedback input, the differential amplifier system feedback input being capacitively coupled to the differential input of the first differential amplifier, the differential amplifier system feedback input also being coupled to an input of a third chopper, the third chopper having an output capacitively coupled to the differential input of the second chopper.

6. The differential amplifier system of claim 5 wherein the first and third choppers have a clock input capacitively coupled to the respective chopper.

7. The differential amplifier system of claim 5 further comprising a voltage divider coupled between the amplifier system output and the differential amplifier system feedback input.

8. A differential amplifier system comprising:
   a first chopper having an input coupled to a differential amplifier system input;
   a first differential amplifier having an input capacitively coupled to an output of the first chopper;
   a second chopper having an input coupled to an output of the first differential amplifier;
   an output of the second chopper being coupled to a differential amplifier system output;
   a third chopper having an input capacitively coupled to the differential amplifier system input;

an output of the third chopper being coupled as an input to an integrator; and an output of the integrator being coupled to the input of the second chopper each side of a differential input to the first differential amplifier and each side of a differential input to the second chopper is coupled to a respective reference voltage through a resistor, and coupled to the respective reference voltage through a pair of diodes coupled in parallel, the pair of diodes being connected with opposite directions of conduction to limit a magnitude of a voltage difference between the respective reference voltage and the respective side of the respective differential input.

9. The differential amplifier system of claim 8 wherein the integrator is a differential amplifier coupled as an integrator, and further comprised of auto-zeroing circuitry for auto-zeroing the differential amplifier coupled as an integrator.

10. The differential amplifier system of claim 8 wherein the first chopper has a clock signal capacitively coupled to the first chopper.

11. The differential amplifier system of claim 8 further comprised of a fourth chopper coupled between the differential input of the first differential amplifier and the differential input of the third chopper.

12. The differential amplifier system of claim 11 further comprising a differential amplifier system feedback input, the differential amplifier system feedback input being capacitively coupled to the differential input of the third chopper, the differential amplifier system feedback input also being coupled to a fifth chopper, an output of the fifth chopper being capacitively coupled to the differential input of the first differential amplifier.

13. The differential amplifier system of claim 12 further comprising a voltage divider coupled between the differential output of the differential amplifier system and the amplifier system feedback input.

14. The differential amplifier system of claim 8 further comprising a differential amplifier system feedback input, the differential amplifier system feedback input being capacitively coupled to the differential input of the third chopper, the differential amplifier system feedback input also being coupled to an input of a fourth chopper, an output of the fourth chopper being capacitively coupled to the differential input of the first differential amplifier.

15. The differential amplifier system of claim 14 wherein the first and fourth choppers have a capacitively coupled clock input.

16. The differential amplifier system of claim 14 further comprising a voltage divider coupled between the differential amplifier system output and the feedback system input.

17. A differential amplifier system comprising:
a differential amplifier system input;
a first differential amplification path, the first differential amplification path being capacitively coupled to the differential amplifier system input, the first amplification path being coupled through a first differential amplifier to a differential amplifier system output, the first differential amplifier having at least first and second first differential amplifier stages, the first differential amplification path not having any choppers therein;
a second differential amplification path, the second differential amplification path being coupled to the differential amplifier system input through a first chopper, an output of the first chopper being capacitively coupled to an input of a second differential amplifier, the output of the second differential amplifier being coupled to a second chopper, an output of the second chopper being coupled to the input of an integrator, the output of the integrator being coupled to the input of a third differential amplifier, the output of the third differential amplifier being coupled to the input of the second stage of the first differential amplifier, the differential amplifier system having hybrid-nested Miller compensation.

18. The differential amplifier system of claim 17 wherein the first chopper has a clock input capacitively coupled to a clock signal.

19. The differential amplifier system of claim 17 wherein each side of a differential input to the first differential amplifier and each side of the differential input to the second differential amplifier is coupled to a respective reference voltage through a resistor, and coupled to the respective reference voltage through a pair of diodes coupled in parallel, the pair of diodes being connected with opposite directions of conduction to limit a magnitude of a voltage difference between the respective reference voltage and the respective side of the respective differential input.

20. The differential amplifier system of claim 17 further comprised of a third chopper coupled between the differential input of the first differential amplifier and the differential input of the second differential amplifier.

21. The differential amplifier system of claim 20 further comprising a differential amplifier system feedback input, the differential amplifier system feedback input being capacitively coupled to the differential input of the first differential amplifier, the differential amplifier system feedback input also being coupled to the input of a fourth chopper, the output of the fourth chopper being capacitively coupled to the differential input of the second differential amplifier.

22. The differential amplifier system of claim 21 further comprising a voltage divider coupled between the amplifier system output and the system feedback input.

23. The differential amplifier system of claim 20 wherein the first and fourth choppers have a clock input capacitively coupled to the clock signal.

24. A differential amplifier system comprising:
a differential amplifier system input;
a first differential amplification path, the first differential amplification path having a first chopper coupled to the differential amplifier system input, the first chopper having a differential output capacitively coupled to a first differential amplifier, the first differential amplifier having a differential output coupled to a second chopper, the second chopper having a differential output coupled through a second differential amplifier to a differential amplifier system output;
a second differential amplification path having a third differential amplifier having an input capacitively coupled to the differential amplifier system input and an output coupled to a third chopper, the third chopper having an output coupled to the input of an integrator, the integrator having an output coupled to the input of a fourth differential amplifier, the fourth differential amplifier having an output coupled to a differential input of the second chopper, the differential amplifier system having hybrid-nested Miller compensation;
each side of a differential input to the first differential amplifier and each side of a differential input to the second differential amplifier is coupled to a respective reference voltage through a resistor, and coupled to the respective reference voltage through a pair of diodes coupled in parallel, the pair of diodes being connected with opposite directions of conduction to limit a magnitude of a voltage difference between the respective reference voltage and the respective side of the respective differential input.

25. The differential amplifier system of claim 24 wherein the first chopper has a clock signal capacitively coupled to the first chopper.

26. The differential amplifier system of claim 24 further comprised of a fourth chopper coupled between the differential input of the first differential amplifier and the differential input of the second differential amplifier.

27. The differential amplifier system of claim 26 further comprising a differential amplifier system feedback input, the differential amplifier system feedback input being coupled to a fifth chopper, an output of the fifth chopper being capacitively coupled to the differential input of the first amplifier, the differential amplifier system feedback input being capacitively coupled to the differential input of the second differential amplifier.

28. The differential amplifier system of claim 27 further comprising a voltage divider coupled to the differential output of the differential amplifier system.

29. The differential amplifier system of claim 27 wherein the first and fifth choppers have a capacitively coupled clock input.

* * * * *